US012566092B2

(12) United States Patent
Schurer et al.

(10) Patent No.: US 12,566,092 B2
(45) Date of Patent: Mar. 3, 2026

(54) METHOD AND DEVICE FOR DETERMINING THE HEATING STATE OF AN OPTICAL ELEMENT IN AN OPTICAL SYSTEM

(71) Applicant: Carl Zeiss SMT GmbH, Oberkochen (DE)

(72) Inventors: Johannes Schurer, Heidenheim (DE); Maike Lorenz, Aalen (DE); Eva Schneider, Aalen (DE); Vladimir Mitev, Aalen (DE); Ruediger Mack, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 404 days.

(21) Appl. No.: 18/320,685

(22) Filed: May 19, 2023

(65) Prior Publication Data

US 2023/0288260 A1    Sep. 14, 2023

Related U.S. Application Data

(63) Continuation of application No. PCT/EP2021/079341, filed on Oct. 22, 2021.

(30) Foreign Application Priority Data

Jan. 19, 2021    (DE) ............................ 102021100995

(51) Int. Cl.
*G03F 7/00* (2006.01)
*G01J 5/02* (2022.01)
(Continued)

(52) U.S. Cl.
CPC ................. *G01J 5/027* (2013.01); *G01J 5/80* (2022.01); *G02B 5/08* (2013.01); *G03F 7/70358* (2013.01); *G03F 7/70891* (2013.01)

(58) Field of Classification Search
CPC .... G01J 5/027; G01J 5/80; G02B 5/08; G02B 7/1815; G03F 7/70358; G03F 7/70891;
(Continued)

(56) References Cited

U.S. PATENT DOCUMENTS 10,161,808 B2    12/2018  Vogt et al.
10,564,555 B2 *   2/2020  Kant ................... G03F 7/70516
(Continued)

FOREIGN PATENT DOCUMENTS

DE     10 2010 061 950 A1    5/2012
DE     10 2013 203 338 A1    8/2014
(Continued)

OTHER PUBLICATIONS

German Office Action, with translation thereof, for corresponding DE Appl No. 10 2021 100 995.2, dated Sep. 14, 2021.
(Continued)

*Primary Examiner* — Hung V Nguyen
*Assistant Examiner* — Hung Henry Nguyen
(74) *Attorney, Agent, or Firm* — Fish & Richardson P.C.

(57) ABSTRACT

A method and a device determine the heating state of an optical element in an optical system, for example in a microlithographic projection exposure system. Electromagnetic radiation hits an incidence surface of the optical element during operation of the optical system. Using a calibration parameter, an average temperature at the incidence surface is estimated on the basis of a temperature measurement carried out via at least one temperature sensor located a distance from the incidence surface. The calibration parameter is selected differently in accordance with the illumination setting which is set in the optical system.

20 Claims, 5 Drawing Sheets

(51) Int. Cl.
  *G01J 5/80*   (2022.01)
  *G02B 5/08*   (2006.01)
(58) Field of Classification Search
  CPC .. G03F 7/70125; G03F 7/705; G03F 7/70516;
                G03F 7/7085
  See application file for complete search history.

(56)       References Cited

U.S. PATENT DOCUMENTS

| | | | | |
|---|---|---|---|---|
| 11,156,922 | B2 * | 10/2021 | De Rapper | ......... G03F 7/70825 |
| 11,747,209 | B2 * | 9/2023 | Leow | ...................... C23C 16/46 |
| | | | | 438/7 |
| 2014/0139816 | A1 | 5/2014 | Hartjes | |
| 2016/0026093 | A1 | 1/2016 | Hauf et al. | |
| 2021/0041790 | A1 | 2/2021 | De Rapper et al. | |

FOREIGN PATENT DOCUMENTS

| | | | |
|---|---|---|---|
| DE | 102018207126 | A1 | 6/2018 |
| DE | 10 2018 208 653 | A1 | 12/2019 |
| DE | 102019213233 | A1 | 5/2020 |

OTHER PUBLICATIONS

International Preliminary Report on Patentability for corresponding PCT Appl No. PCT/EP2021/079341, dated Aug. 3, 2023 (with translation).
Translation of International Search Report for corresponding PCT Appl No. PCT/EP2021/079341, dated Feb. 22, 2022.

\* cited by examiner $$T_S = T$$

$$T_S < T$$

$$T_S > T$$

METHOD AND DEVICE FOR DETERMINING THE HEATING STATE OF AN OPTICAL ELEMENT IN AN OPTICAL SYSTEM

CROSS-REFERENCE TO RELATED APPLICATIONS

The present application is a continuation of, and claims benefit under 35 USC 120 to, international application PCT/EP2021/079341, filed Oct. 22, 2021, which claims benefit under 35 USC 119 of German Application No. 10 2021 100 995.2, filed Jan. 19, 2021. The entire disclosure of these applications are incorporated by reference herein.

FIELD

The disclosure relates to a method and a device for determining the heating state of an optical element in an optical system, such as in a microlithographic projection exposure apparatus.

BACKGROUND

Microlithography is used for producing microstructured components, such as for example integrated circuits or LCDs. The microlithography process is carried out in what is known as a projection exposure apparatus, which has an illumination device and a projection lens. The image of a mask (=reticle) illuminated via the illumination device is projected in this case via the projection lens onto a substrate (for example a silicon wafer) that is coated with a light-sensitive layer (photoresist) and arranged in the image plane of the projection lens in order to transfer the mask structure to the light-sensitive coating of the substrate.

In projection lenses designed for the EUV range, which is to say at wavelengths of for example approximately 13 nm or approximately 7 nm, mirrors are typically used as optical components for the imaging process owing to the general lack of availability of suitable light-transmissive refractive materials. As a result of absorption of the radiation emitted by the EUV light source among other reasons, the EUV mirrors can heat up and can undergo an associated thermal expansion or deformation, which in turn can negatively affect the imaging properties of the optical system.

One known way of taking this effect into account is to use a material with ultra-low thermal expansion ("Ultra Low Expansion Material"), for example a titanium silicate glass sold by Corning Inc. with the name ULE™, as the mirror substrate material and to set what is known as the zero-crossing temperature in a region near the optical effective surface. At this zero-crossing temperature, which lies at around $\vartheta=30°$ C. for example for ULE™, the coefficient of thermal expansion has in its temperature dependence a zero crossing in the vicinity of which no thermal expansion or only negligible thermal expansion of the mirror substrate material takes place.

However, in practice, an EUV mirror is exposed during the operation of the microlithographic projection exposure apparatus to changing intensities of the incident electromagnetic radiation, specifically both locally, for example due to the use of illumination settings with an intensity that varies over the optical effective surface of the respective EUV mirror, and also temporally, wherein the relevant EUV mirror typically heats up for example at the beginning of the microlithographic exposure process from a comparatively low temperature to its operating temperature reached in the lithography process.

Here and hereinafter, "illumination setting" is understood to mean the intensity distribution in a pupil plane of the optical system. Typical illumination settings set in a microlithographic projection exposure apparatus are, for example, a dipole illumination setting or a quadrupole illumination setting.

Approaches to addressing surface deformations caused by varying heat inputs into an EUV mirror and the optical aberrations associated with such deformations include, for example, active cooling or the use of pre-heaters (active mirror heating being able to be implemented using such pre-heaters during phases of comparatively low absorption of EUV used radiation, and this being able to be scaled back accordingly with increasing absorption of the EUV used radiation).

Closed-loop control of the operation of such pre-heaters carried out with the goal of maintaining a mirror temperature that is as constant as possible (typically the aforementioned zero-crossing temperature) often involves knowledge of the radiant power incident on the relevant mirror in each case, in order to allow the pre-heating power to be adapted accordingly. Temperature sensors that can be attached typically to the mirror's back side at an appropriate distance from the optical effective surface of the respective mirror are used to this end (in addition to infrared cameras, which are not always practical for installation space reasons).

In practice, however, the temperature values measured by such temperature sensors can be sensitively dependent on the respective sensor position should the three-dimensional temperature distribution setting in over the volume of the mirror not be homogeneous in space.

FIGS. 5A-5D show schematic representations, with the optical effective surface of an optical element in the form of a mirror being denoted by "501" and a temperature sensor by "520". Furthermore, "$T_S$" denotes the temperature measured by the temperature sensor 520 and "T" is the average temperature sought after at the incidence surface 501. Hatching in each case indicates whether a homogeneous temperature distribution or an inhomogeneous temperature distribution is assumed within the optical element.

In FIGS. 5A-5D, only in the case of a homogeneous temperature distribution in accordance with FIG. 5A does the temperature $T_S$ measured by the temperature sensor 520 correspond to the sought-after average temperature T at the incidence surface 501, regardless of the sensor position. In the case of an inhomogeneous temperature distribution within the optical element, the temperature sensor 520 supplies "incorrect" values, which is to say values $T_S$ that deviate from the sought-after average temperature T at the incidence surface 501, with a placement of the temperature sensor 520 in the vicinity of the minimum of an inhomogeneous temperature distribution, especially in accordance with FIG. 5B, resulting in a measured temperature $T_S$ that is too low in comparison with the actual temperature T, and a placement of the temperature sensor 520 in the vicinity of the maximum of the inhomogeneous temperature distribution in accordance with FIG. 5C resulting in a measured temperature $T_S$ that is too high.

In this case, FIGS. 5A-5C only show a simplified, two-dimensional view of the problem. As indicated in FIG. 5D, the temperature sensor position actually has three degrees of freedom, which can make it even more difficult to draw conclusions about the sought-after average temperature T at the incidence surface 501 in the case of an inhomogeneous temperature distribution within the optical element.

An incorrect determination of the heating state on the basis of the temperature measured by one or more temperature sensors, for instance in the case of use in the aforementioned pre-heating concept, can result in the corresponding closed-loop control reacting unsuitably, resulting in no adequate adjustment of the pre-heating power. This in turn may lead to thermally induced deformations, optical aberrations resulting therefrom, and an associated impairment of the imaging properties of the optical system or the projection exposure apparatus.

SUMMARY

The present disclosure seeks to provide a method and a device for determining the heating state of an optical element in an optical system, such as in a microlithographic projection exposure apparatus, which allow a more reliable temperature sensor-based characterization of the heating state.

The disclosure relates to a method for determining the heating state of an optical element in an optical system, such as in a microlithographic projection exposure apparatus, wherein electromagnetic radiation is incident on an incidence surface of the optical element during the operation of the optical system and wherein an average temperature present at the incidence surface is estimated on the basis of a temperature measurement carried out using at least one temperature sensor arranged at a distance from the incidence surface, using a calibration parameter; and wherein this calibration parameter is selected differently depending on the illumination setting set in the optical system.

The disclosure involves the concept of estimating a sought-after average surface temperature of an optical element such as a mirror, for example, on the basis of temperature values measured at a different position of the optical element, not merely on the basis of a single relationship between the sought-after surface temperature and the sensor-based measured temperature, which relationship is identical for all possible application scenarios and fixed in this sense, but by selecting a different calibration parameter, which is used for the conversion of the measured values ascertained during the temperature measurement, on the basis of the respective application scenario, for example the illumination setting set in the optical system.

According to the disclosure, a greater effort potentially accompanying a more complex calibration is deliberately accepted in return for avoiding issues described at the outset and associated with an incorrect determination of the heating state (for example a potentially inadequate adjustment of a pre-heating power which is controlled on the basis of the determination of the heating state).

The specific implementation of the calibration according to the disclosure can occur in different ways, as described in more detail hereinafter, with it being possible for example to use existing knowledge with regard to the thermal behavior of the optical system or optical element for a predefined reference illumination setting.

According to an embodiment, the calibration parameter for the illumination setting currently set in the optical system is hence determined on the basis of a reference calibration parameter previously ascertained for a reference illumination setting.

According to an embodiment, the calibration parameter is determined on the basis of at least one measurement or simulation of a variable for the illumination setting currently set in the optical system, the variable being dependent on the thermal state of the optical element.

According to an embodiment, this variable dependent on the thermal state of the optical element is an intensity distribution generated during the operation of the optical system in a plane located downstream of the optical element in relation to the beam path. In this context, the disclosure can make use of the fact that, for instance in a projection exposure apparatus, the intensity setting in in the region of the wafer plane during operation is typically measured in any case using intensity sensors present there, and so this information is generally already available and can be used for the calibration according to the disclosure.

According to an embodiment, the variable dependent on the thermal state of the optical element is a wavefront generated during the operation of the optical system in a plane located downstream of the optical element in relation to the beam path. In this context, the disclosure can make use of the fact that the wavefront determination can be used to draw conclusions about the change in the optical element (for example its thermally induced deformation) on the basis of knowledge of the optical design and the application of tomographic methods known per se. In this context, reference is made to DE 10 2019 213 233 A1 by way of example.

According to an embodiment, the calibration parameter is also determined taking into account a distance of the temperature sensor from the incidence surface.

In other words, the geometric information relating to the distance of the sensor from the incidence surface is used here as additional information for the calibration according to the disclosure. As described hereinafter, this can in turn be used in combination with a time-resolved temperature measurement, for example to already realize a comparatively reliable characterization of the heating state of the optical element or mirror immediately after the optical system has been put into operation and, for example when used in the above-described pre-heating concept, to reliably protect the optical element from thermally induced deformations already in a start-up phase.

According to an embodiment, the temperature measurement is hence carried out repeatedly using the temperature sensor to ascertain a time profile.

According to an embodiment, the temperature sensor is arranged in an access channel which extends from a side of the optical element facing away from the incidence surface into the optical element.

According to an embodiment, the estimated average temperature is used as an input signal for closed-loop control of at least one parameter characterizing the optical element and/or the optical system.

According to an embodiment, a pre-heating of the optical element is controlled on the basis of the estimated average temperature in order to at least partially compensate for changes in the heating state of the optical element over time which occur during the operation of the optical system.

According to an embodiment, the optical element is a mirror.

According to an embodiment, the optical element is designed for an operating wavelength of less than 30 nm, for example less than 15 nm.

According to an embodiment, the optical system is a microlithographic projection exposure apparatus.

According to an embodiment, the calibration parameter is selected differently depending on a reticle used in the projection exposure apparatus.

According to an embodiment, the above-described steps are carried out during the operation of the microlithographic projection exposure apparatus.

The disclosure furthermore relates to a device for determining the heating state of a mirror in an optical system, for example in a microlithographic projection exposure apparatus, wherein the device is configured to carry out a method with the above-described features. With regard to features and configurations of the device, reference is made to the above explanations in association with the method according to the disclosure.

Further embodiments of the disclosure are evident from the description and the claims.

The disclosure is explained in greater detail below on the basis of exemplary embodiments illustrated in the accompanying figures.

DETAILED DESCRIPTION

Figure 1:
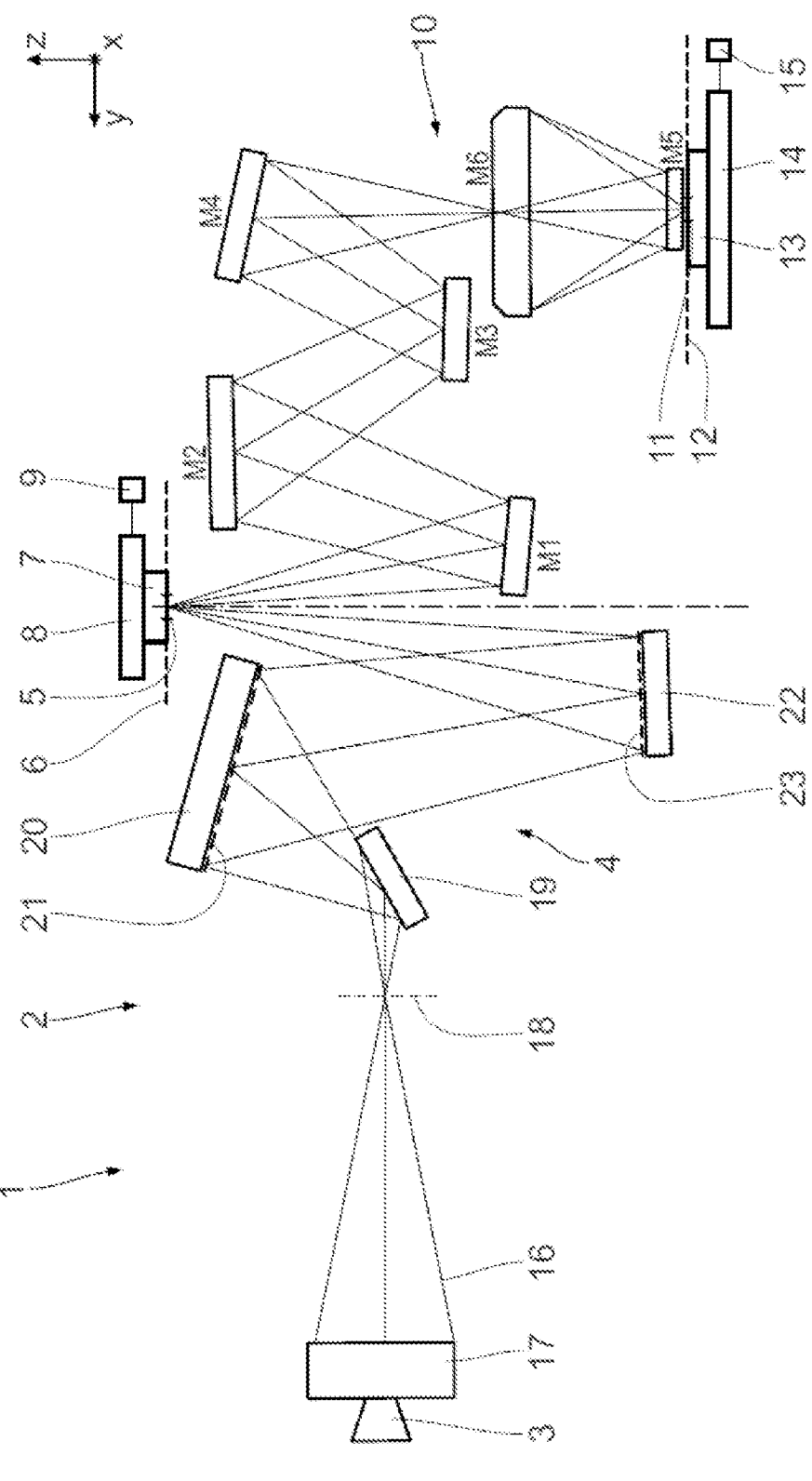
FIG. 1 shows a schematic illustration of the possible structure of a microlithographic projection exposure apparatus designed for operation in the EUV.

FIG. 1 shows a schematic illustration of a projection exposure apparatus 1 which is designed for operation in the EUV and in which the disclosure is realizable by way of example. The description of the basic structure of the projection exposure apparatus 1 and its components should not be construed as limiting here.

One embodiment of an illumination system 2 of the projection exposure apparatus 1 has, in addition to a light or radiation source 3, an illumination optical unit 4 for illuminating an object field 5 in an object plane 6. In an alternative embodiment, the light source 3 may also be provided as a module separate from the rest of the illumination system. In this case, the illumination system does not comprise the light source 3.

Here, a reticle 7 arranged in the object field 5 is exposed. The reticle 7 is held by a reticle holder 8. The reticle holder 8 is displaceable by way of a reticle displacement drive 9 for example in a scanning direction. For purposes of elucidation, a Cartesian xyz-coordinate system is shown in FIG. 1. The x-direction runs perpendicularly to the plane of the drawing. The y-direction runs horizontally, and the z-direction runs vertically. The scanning direction runs in the y-direction in FIG. 1. The z-direction runs perpendicularly to the object plane 6.

The projection lens 10 serves for imaging the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15 for example longitudinally with respect to the y-direction. The displacement, firstly, of the reticle 7 by way of the reticle displacement drive 9 and, secondly, of the wafer 13 by way of the wafer displacement drive 15 may be implemented so as to be mutually synchronized.

The radiation source 3 is an EUV radiation source. The radiation source 3 emits, for example, EUV radiation, which is also referred to below as used radiation or illumination radiation. For example, the used radiation has a wavelength in the range of between 5 nm and 30 nm. The radiation source 3 can be for example a plasma source, a synchrotron-based radiation source or a free electron laser (FEL). The illumination radiation 16 emanating from the radiation source 3 is focused by a collector 17 and propagates through an intermediate focus in an intermediate focal plane 18 into the illumination optical unit 4. The illumination optical unit 4 comprises a deflection mirror 19 and, disposed downstream thereof in the beam path, a first facet mirror 20 (having schematically indicated facets 21) and a second facet mirror 22 (having schematically indicated facets 23).

The projection lens 10 comprises a plurality of mirrors Mi (i=1, 2, . . . ), which are consecutively numbered in accordance with their arrangement in the beam path of the projection exposure apparatus 1. In the example illustrated in FIG. 1, the projection lens 10 comprises six mirrors M1 to M6. Alternatives with four, eight, ten, twelve or any other number of mirrors Mi are similarly possible. The penultimate mirror M5 and the last mirror M6 each have a through opening for the illumination radiation 16. The projection lens 10 is a doubly obscured optical unit. The projection lens 10 has an image-side numerical aperture that is greater than 0.5 and may also be greater than 0.6, and may be for example 0.7 or 0.75.

During operation of the microlithographic projection exposure apparatus 1, the electromagnetic radiation incident on the optical effective surface of the mirrors is partly absorbed and, as explained in the introduction, results in heating and an associated thermal expansion or deformation, which can in turn result in an impairment of the imaging properties of the optical system. The temperature of the mirrors can now be suitably controlled via a suitable correction mechanism (e.g., pre-heaters).

Figure 2:
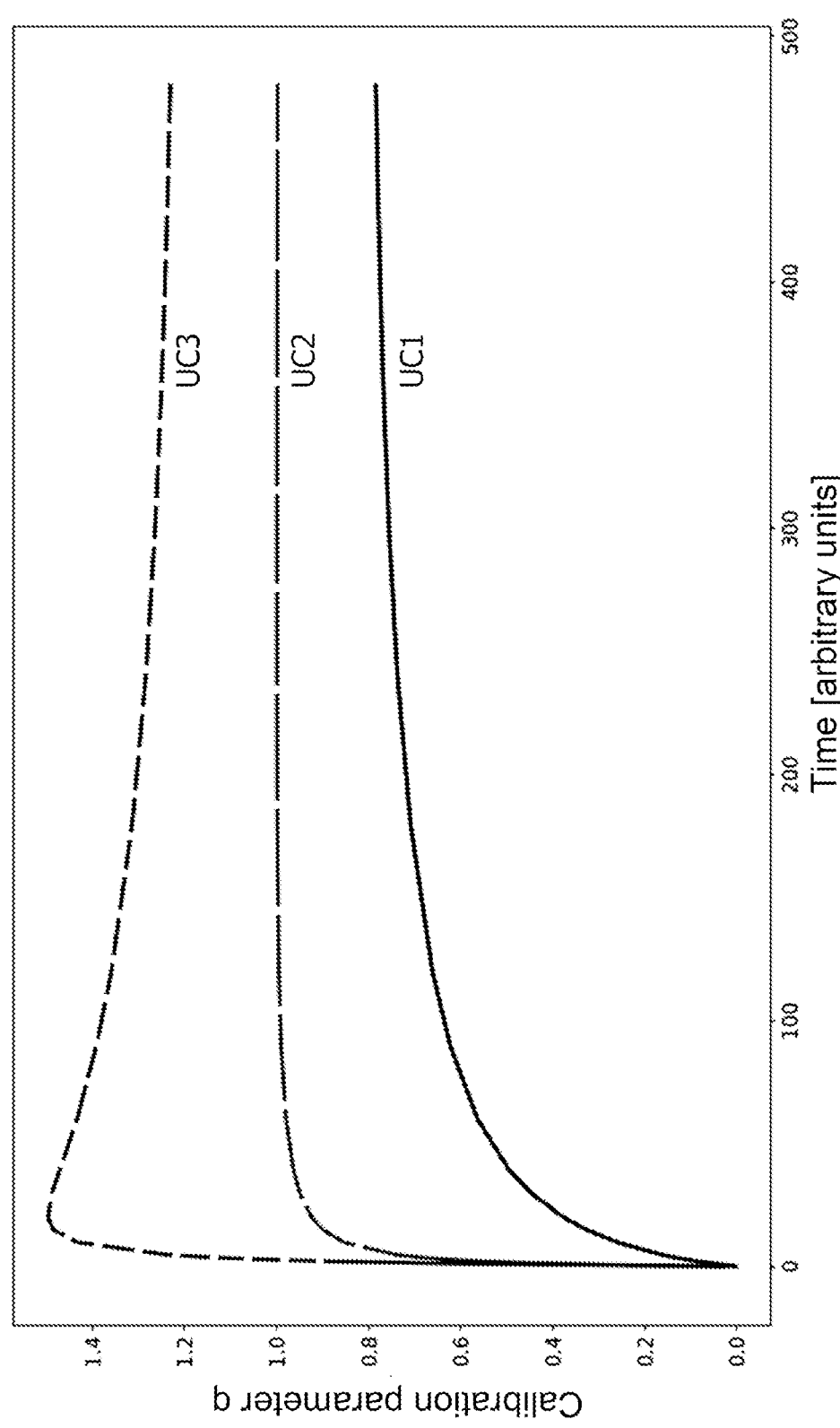
FIG. 2 shows a diagram which shows, by way of example, different time profiles of a calibration parameter caused by different illumination settings and ascertained and used in a method according to the disclosure.
Figure 3:
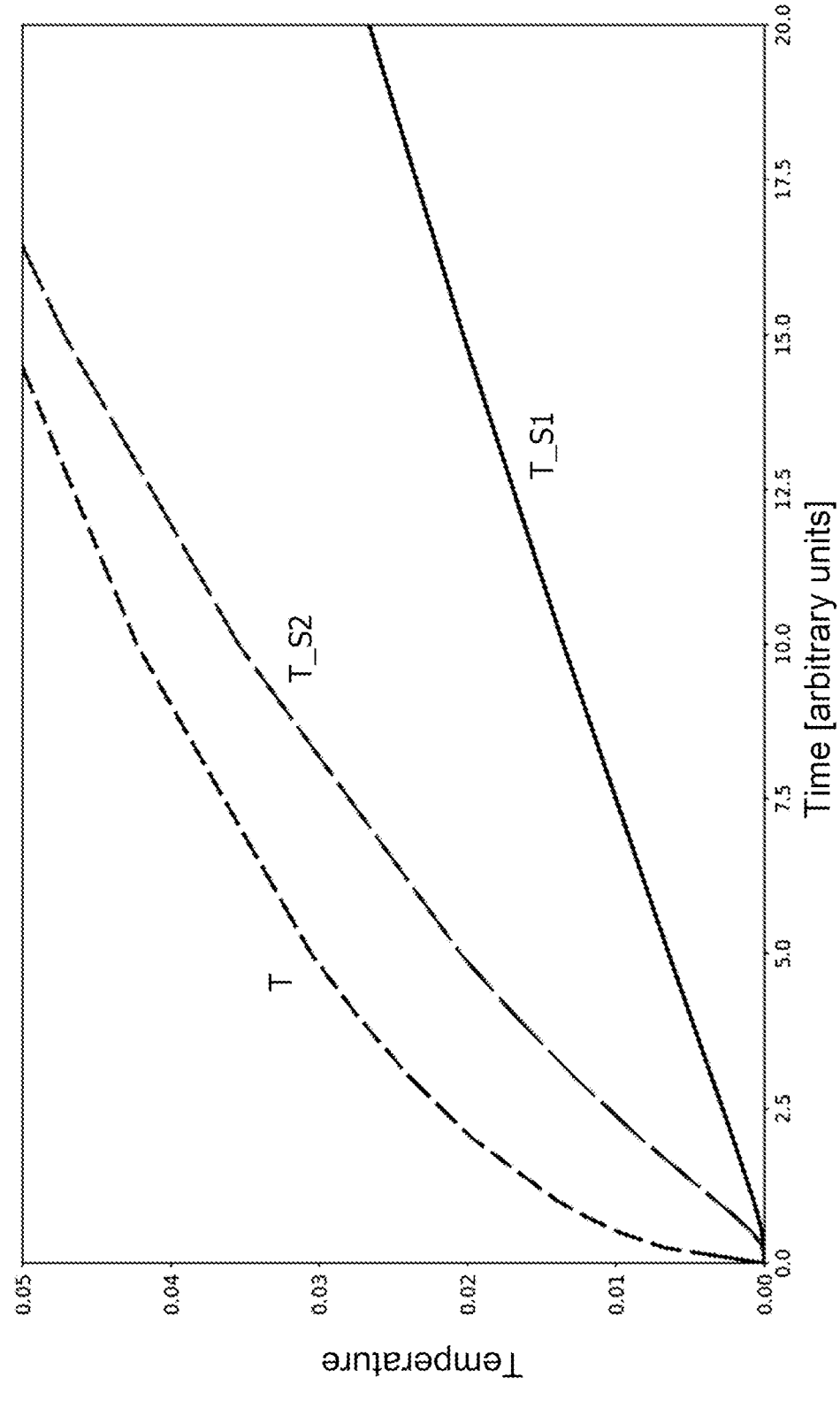
FIG. 3 shows a diagram which shows the time profile of the respective measurement signal for different sensor positions, in comparison with the real average temperature at the surface of an optical element.
Figure 4:
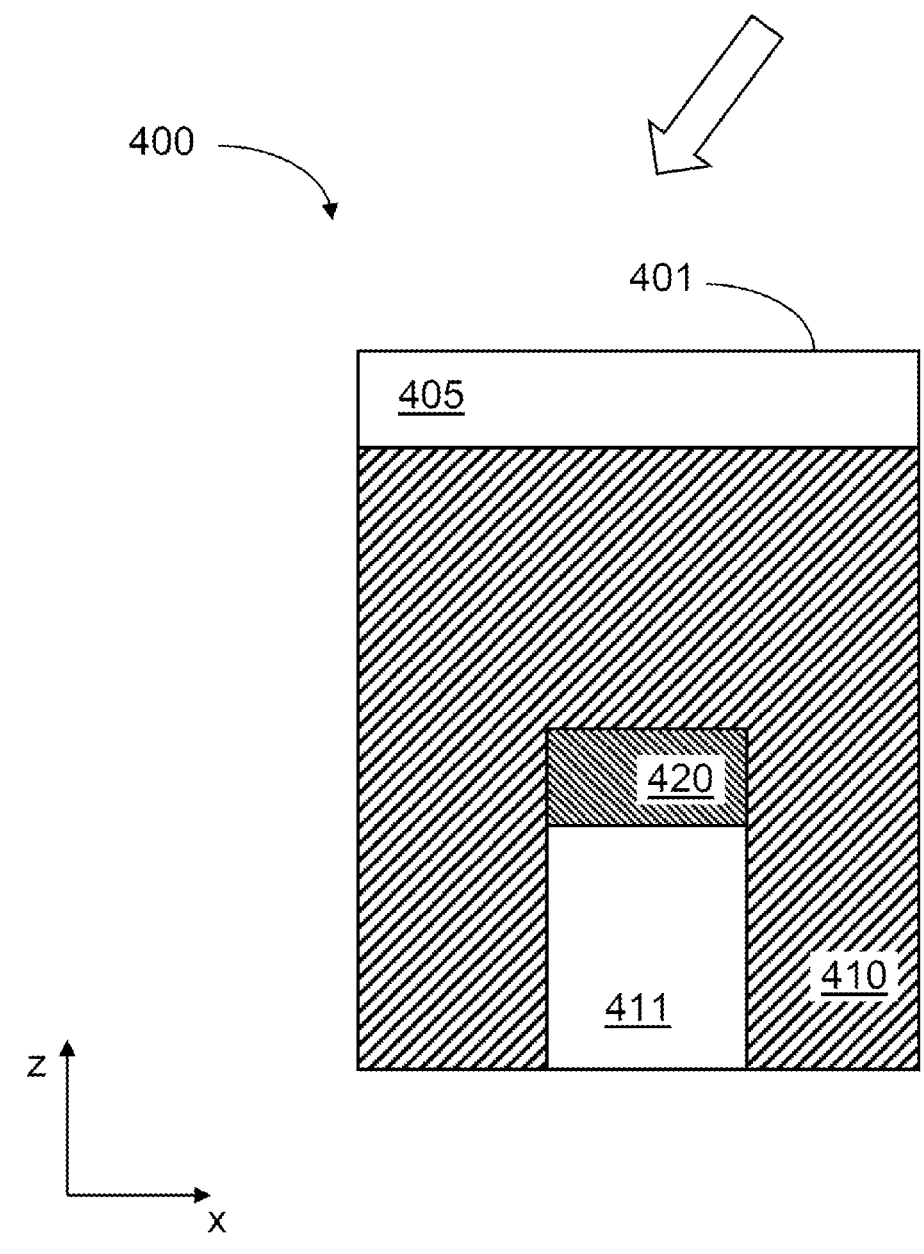
FIG. 4 shows a schematic illustration for explaining the possible structure of a mirror with which the method according to the disclosure can be realized in exemplary fashion.
Figures 5A, 5B, 5C, 5D:
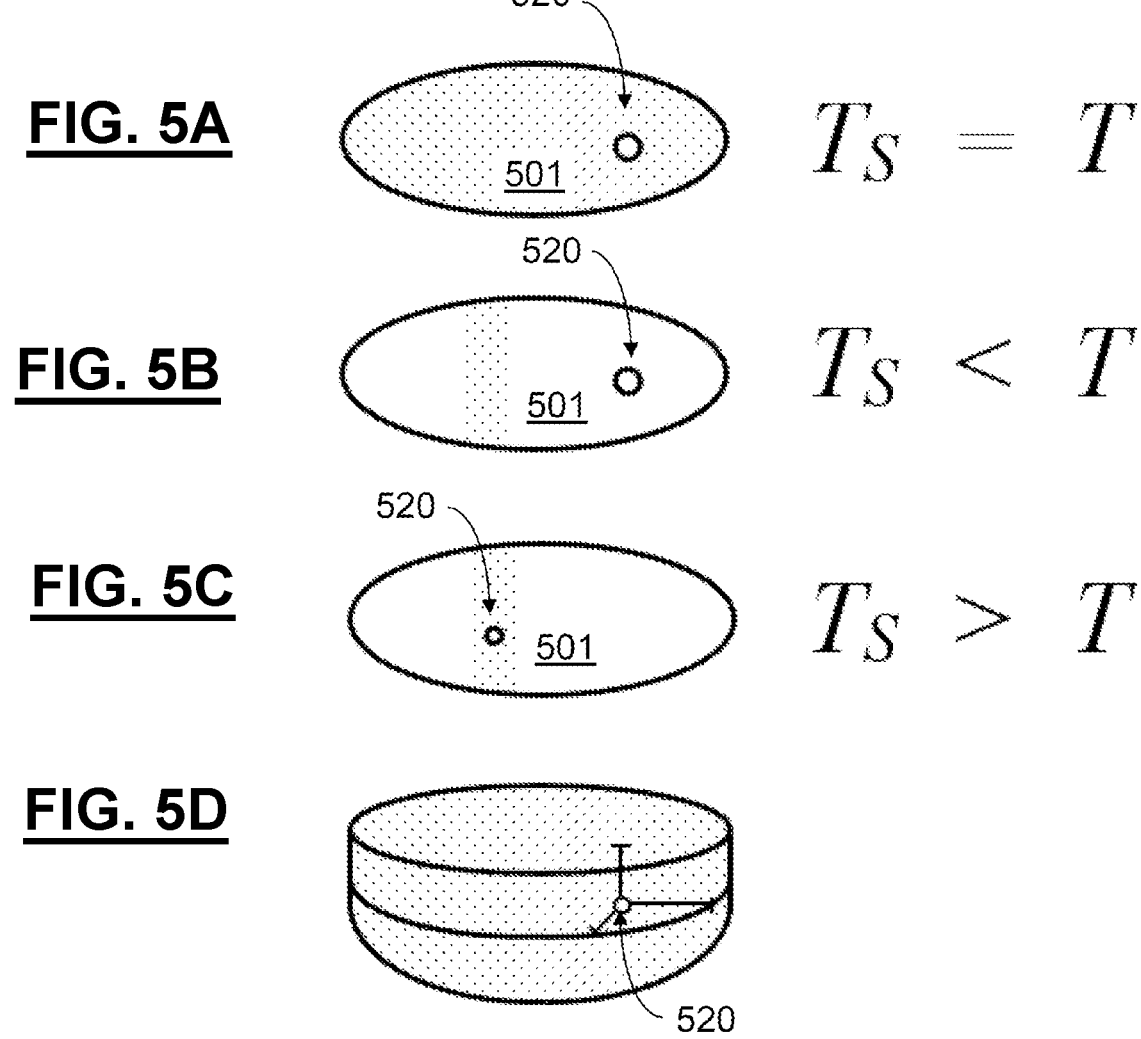
FIGS. 5A-5D show diagrams for explaining a problem encountered in a conventional method for ascertaining the thermal state of a mirror.

With reference to FIG. 2 to FIG. 4, embodiments of a method according to the disclosure will be described below for correspondingly estimating the heating state of the mirror in question and for possibly correspondingly controlling a suitable correction mechanism such as pre-heaters, for example. The concept according to the disclosure for determining the heating state can be applied here to any desired mirror of the microlithographic projection exposure apparatus 1 from FIG. 1.

FIG. 4 shows, in a purely schematic illustration, the possible arrangement of a temperature sensor 420 at an optical element 400 in the form of a mirror. According to FIG. 4 (however, without the disclosure being limited thereto), the temperature sensor 420 is located in a borehole introduced as an access channel 411 into the mirror substrate 410 from the back side of the mirror. "405" denotes a reflection layer system and "401" denotes the optical effective surface or incidence surface of the mirror for electromagnetic radiation.

What the embodiments described below have in common is that a calibration parameter used to estimate an average temperature present on the incidence surface of an optical element or mirror on the basis of a sensor-based temperature measurement is not chosen to be constant and fixed for all use scenarios or operating states in the optical system, but is chosen differently depending on the illumination setting currently set in the optical system (possibly additionally dependent on the reticle used in each case). If the calibration parameter is denoted by "q", the sought-after average temperature at the incidence surface of the optical element or mirror is denoted by "T", and the temperature measured with the aid of sensors is denoted by "$T_S$", then the following applies:

$$T = q \cdot T_S \tag{1}$$

According to a first embodiment, the calibration parameter for the illumination setting currently set in the optical system can be determined on the basis of a reference calibration parameter previously ascertained for a reference illumination setting. If a single measurement of the temperature taking place at a single point in time is initially taken as a starting point in this case, and if the sought-after average temperature T at the incidence surface and the associated sensor-based measured temperature $T_S$ are assumed as known for the reference illumination setting, then the reference illumination setting (corresponding to the use scenario known in advance) and the illumination setting currently set in the optical system (corresponding to the unknown use scenario) can be related to one another, as described hereinafter, wherein, for example, use can be made of the resultant power behind the reticle for both use scenarios.

If this power for the reference illumination setting or the use scenario known in advance is denoted by $$P_{AR}^R$$

and this power for the currently set illumination setting or the unknown use scenario is denoted by $$P_{AR}^U,$$

then the following arises under the assumption of a linear relationship:

$$\frac{T^U}{T^R} = \frac{P_{AR}^U}{P_{AR}^R} = \mu \tag{2}$$

This results in the calibration parameter for the currently set illumination setting or the unknown use scenario as follows:

$$q^U = q^R \cdot \mu \cdot \frac{T_S^R}{T_S^U} \tag{3}$$

Consequently, different calibration parameters $q^U$ arise depending on the currently set illumination setting or use scenario.

In this respect, FIG. 2 shows merely exemplary possible time profiles of the calibration parameter $q^U$ for three different use scenarios (denoted by UC1, UC2 and UC3, respectively). A value of the calibration parameter $q^U < 1$ emerges at all times for the use scenario UC1. For the use scenario UC2, the value of the calibration parameter $q^U$ deviates from the value one only within a comparatively short period of time after the optical system has been put into operation. In the use scenario UC3, $q^U < 1$ applies for comparatively short times, $q^U > 1$ for comparatively large times, and the calibration parameter $q^U$ (corresponding to an "overshoot") temporarily increases relatively strongly on a medium time scale.

In embodiments of the disclosure, the temperature measurement with at least one temperature sensor 420 can also be carried out to ascertain a time profile. In this way, it is possible to take account of the fact that, depending on the position of the temperature sensor, a temperature change occurring at the incidence surface of the optical element or mirror becomes "visible" on the temperature sensor with various degrees of quickness, which is to say the respective temperature sensor "sees" the temperature change belatedly.

To this end, FIG. 3 shows a diagram in which the time profile of the respective measurement signal is plotted for two different sensor positions, in comparison with the actual average temperature at the incidence surface of the optical element. According to FIG. 3, the sought-after average temperature T at the incidence surface rises for instance immediately after the optical system is switched on, whereas sensors located at different distances from the incidence surface deliver correspondingly delayed measurement signals. Using the heat conduction equation $$\frac{\partial T(\vec{r}, t)}{\partial T} - \alpha \cdot \Delta T(\vec{r}, t) = f(\vec{r}, t) \tag{4}$$

with the thermal conductivity $\alpha$ and the source $f(\vec{r}, t)$, it is possible to specify for instance the following dependence of the respective sensor-based measured temperature $T_S$ on the distance $r_Z$ of the temperature sensor from the incidence surface merely as an example for an analytical relationship—without the disclosure being limited thereto—under simplified boundary conditions (for example the assumption of an infinitely large optical element with surfaces parallel to the xy-plane and the assumption of a homogeneous light load):

$$\frac{T_S}{T} = q \approx e^{\frac{-r_z^2}{4\alpha t}} - \sqrt{\frac{\pi r_z^2}{4\alpha t}} \left[ 1 - \mathrm{erf}\left( \sqrt{\frac{r_z^2}{4\alpha t}} \right) \right] \tag{5}$$

As a result, the temperature $T_S$ measured by a temperature sensor on account of its position can thus be determined as a function of time and used for a determination of the calibration parameter for reliable characterization of the heating state of the optical element or mirror, already for the aforementioned start-up phase immediately after switching on the optical system.

In further embodiments, a numerical determination of the calibration parameter $q^U$ can be carried out, in which case, in addition to knowledge of the currently used illumination setting and reticle, a model for the optical system that is as realistic as possible is used as a basis. On the basis thereof, the temperature distribution setting-in in the optical element can be predicted and the temperature $T_S$ which a temperature sensor would measure at its respective position can be calculated. On the basis thereof, the calibration parameter $q^U$ can be determined using equation (1).

If the currently used illumination setting is not specifically known, it may also be possible to select from a previously created library (lookup table) of illumination settings that illumination setting which comes closest to the desired setting or the currently used illumination setting.

In further embodiments, a temperature measurement or temperature simulation can be replaced by a wavefront measurement or wavefront simulation in order to use the wavefront (e.g., determined in the region of the wafer plane) to draw conclusions about the thermal change in the optical element or mirror. In this case, too, the currently used illumination setting can be classified by comparing the deformation ascertained on the basis of the measured wavefront with the deformation of illumination settings calculated in advance, in order in this way to determine the calibration parameter $q^U$.

Even though the disclosure has also been described on the basis of specific embodiments, numerous variations and alternative embodiments will be apparent to a person skilled in the art, for example by the combination and/or exchange of features of individual embodiments. Accordingly, it goes without saying for a person skilled in the art that such variations and alternative embodiments are concomitantly encompassed by the present disclosure, and the scope of the disclosure is restricted only within the meaning of the appended patent claims and the equivalents thereof.

What is claimed is:

1. A method, comprising:
exposing an incidence surface of an optical element to electromagnetic radiation;
measuring a temperature using at least one temperature sensor arranged at a distance from the incidence surface;
determining a calibration parameter based on an illumination setting in the optical system; and
using the calibration parameter to estimate an average temperature of the incidence surface based on the temperature measurement,
wherein the method further comprises determining the calibration parameter based on at least one measurement or simulation of a variable for the illumination setting currently set in the optical system, wherein the variable depends on a thermal state of the optical element, and
wherein:
the variable dependent on the thermal state of the optical element is an intensity distribution generated during the operation of the optical system in a plane located downstream of the optical element along a beam path of the electromagnetic radiation through the optical system; or
the variable dependent on the thermal state of the optical element is a wavefront generated during the operation of the optical system in a plane located downstream of the optical element along a beam path of the electromagnetic radiation through the optical system.

2. The method of claim 1, further comprising:
ascertaining a reference illumination setting; and determining the calibration parameter based on a reference calibration parameter for the reference illumination setting.

3. The method of claim 1, wherein the variable dependent on the thermal state of the optical element is an intensity distribution generated during the operation of the optical system in a plane located downstream of the optical element along a beam path of the electromagnetic radiation through the optical system.

4. The method of claim 1, wherein the variable dependent on the thermal state of the optical element is a wavefront generated during the operation of the optical system in a plane located downstream of the optical element along a beam path of the electromagnetic radiation through the optical system.

5. The method of claim 1, further comprising taking into account the distance of the at least one temperature sensor from the incidence surface when determining the calibration parameter.

6. The method of claim 1, further comprising repeatedly making the temperature measurement using the at least one temperature sensor, thereby ascertaining a time profile.

7. The method of claim 1, wherein the at least one temperature sensor is arranged in an access channel which extends from a side of the optical element facing away from the incidence surface into the optical element.

8. The method of claim 1, further comprising using the estimated average temperature as an input signal for closed-loop control of at least one parameter characterizing the optical element and/or the optical system.

9. The method of claim 1, further comprising controlling a pre-heating of the optical element based on the estimated average temperature to at least partially compensate for changes in the heating state of the optical element over time which occur during the operation of the optical system.

10. The method of claim 1, wherein the optical element comprises a mirror.

11. The method of claim 1, wherein the electromagnetic radiation has a wavelength of less than 30 nm.

12. The method of claim 1, wherein the optical system is a microlithographic projection exposure apparatus.

13. The method of claim 12, further comprising selecting the calibration parameter depending on a reticle used in the projection exposure apparatus.

14. The method of claim 13, wherein the average temperature is estimated during the operation of the microlithographic projection exposure apparatus.

15. The method of claim 12, wherein the average temperature is estimated during the operation of the microlithographic projection exposure apparatus.

16. A method of estimating an average temperature of an incidence surface of an optical element of an optical system, the optical element configured to have electromagnetic radiation incident thereon during use of the optical system, the method comprising:
measuring a temperature using at least one temperature sensor arranged at a distance from the incidence surface;
determining a calibration parameter based on an illumination setting in the optical system; and
using the calibration parameter to estimate the average temperature of the incidence surface based on the temperature measurement,
wherein the method further comprises determining the calibration parameter based on at least one measurement or simulation of a variable for the illumination setting currently set in the optical system, wherein the variable depends on a thermal state of the optical element, and wherein:

the variable dependent on the thermal state of the optical element is an intensity distribution generated during the operation of the optical system in a plane located downstream of the optical element along a beam path of the electromagnetic radiation through the optical system; or the variable dependent on the thermal state of the optical element is a wavefront generated during the operation of the optical system in a plane located downstream of the optical element along a beam path of the electromagnetic radiation through the optical system.

17. The method of claim 16, wherein the variable dependent on the thermal state of the optical element is an intensity distribution generated during the operation of the optical system in a plane located downstream of the optical element along a beam path of the electromagnetic radiation through the optical system.

18. The method of claim 16, wherein the variable dependent on the thermal state of the optical element is a wavefront generated during the operation of the optical system in a plane located downstream of the optical element along a beam path of the electromagnetic radiation through the optical system.

19. The method of claim 16, wherein the optical system is a microlithographic projection exposure apparatus.

20. The method of claim 19, further comprising selecting the calibration parameter depending on a reticle used in the projection exposure apparatus.

* * * * *